United States Patent [19]

Martino

[11] 4,213,420
[45] Jul. 22, 1980

[54] APPARATUS FOR PROCESSING A PARTICULATING PRINTING PLATE

[76] Inventor: Peter V. Martino, 9960 65th Rd., Rego Park, N.Y. 11374

[21] Appl. No.: 932,370

[22] Filed: Aug. 9, 1978

[51] Int. Cl.² .......................... G03D 5/04; B05C 5/00
[52] U.S. Cl. ................................... 118/713; 118/103; 118/114; 118/314; 118/316; 354/325
[58] Field of Search ....................... 354/317, 318, 325; 118/316, 9, 106, 603, 117, 610, 114, 103, 314, 109, 712, 713; 134/64 R, 64 P, 122 R, 122 P, 83; 15/77, 102, 114, 182; 137/91; 210/458, 182

[56] References Cited

U.S. PATENT DOCUMENTS

| | | | |
|---|---|---|---|
| 2,701,062 | 2/1955 | Robinson | 210/458 |
| 3,080,976 | 3/1963 | Thompson et al. | 210/458 X |
| 3,233,272 | 2/1966 | Pambello | 15/182 |
| 3,557,817 | 1/1971 | Royse | 137/91 |
| 3,613,701 | 10/1971 | Ando | 134/64 R |
| 3,682,079 | 8/1972 | Casson, Jr. | 354/318 |
| 3,809,105 | 5/1974 | Horn | 15/77 |
| 3,916,426 | 10/1975 | Bown | 354/325 X |

*Primary Examiner*—John P. McIntosh
*Attorney, Agent, or Firm*—Anthony J. Casella

[57] ABSTRACT

An apparatus for processing a particulating printing plate includes an outer casing having an entrance end and an exit end, and a pair of opposed side portions. The exit end of the apparatus is disposed at an upward tilt relative to the entrance end. In addition, one side portion is disposed at an upward tilt relative to the other side portion. A pair of entry rollers is disposed one above the other adjacent the entrance end of the outer casing for receiving the plate and conveying it in a horizontal direction. A first sprayer for spraying developer solution onto one surface of the plate is disposed adjacent the downstream ends of the entry rollers. First and second brushes are disposed one above the other and adjacent to the first sprayer for brushing away unwanted coatings on the plate after it has been sprayed. The upper brush is an individually rotatable roller which is adapted to be rotated in a direction opposite to that of the conveyance of the plate. The upper brush is rotatable relative to the bottom brush in a direction opposite to that of the direction of the conveyance of the plate and the rotation of the lower brush, and at a speed greater than that of the entry rollers. A second sprayer is disposed adjacent the brush members for spraying fresh developer solution onto the plate after it has been brushed. A pair of squeege rollers is disposed adjacent the second sprayer for removing excess solution from the plate and directing it towards the exit end of the outer casing.

24 Claims, 4 Drawing Figures

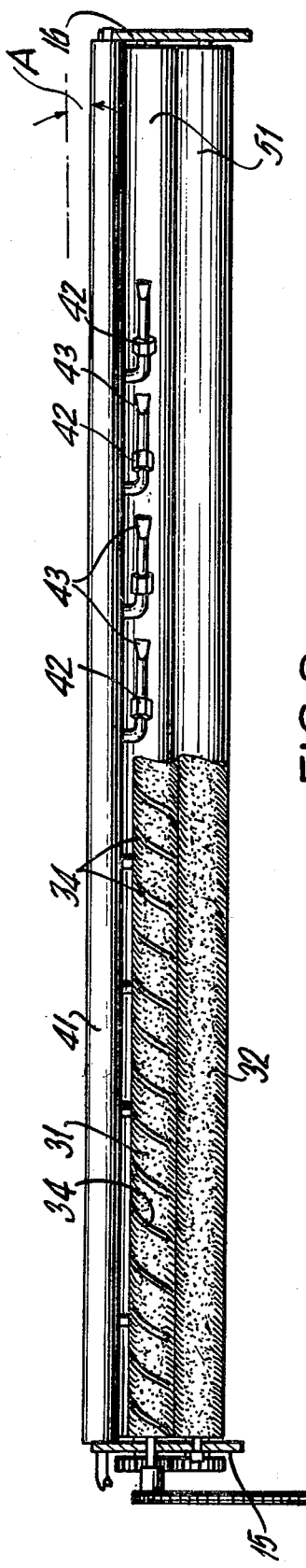
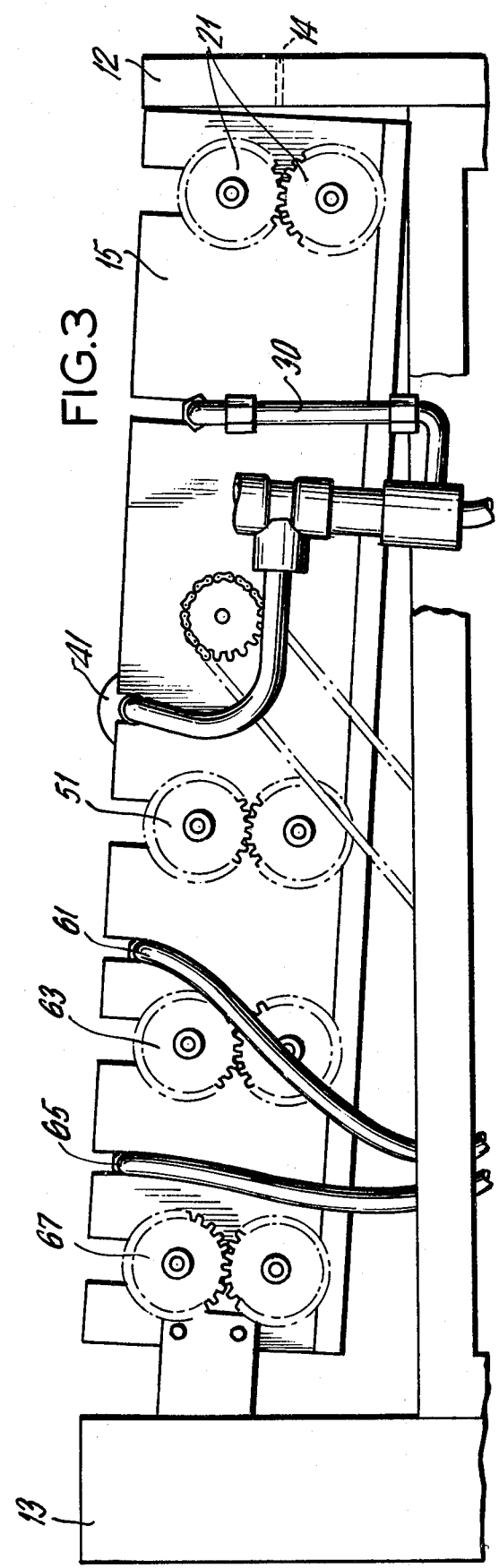
FIG.2
FIG.3

APPARATUS FOR PROCESSING A PARTICULATING PRINTING PLATE

BACKGROUND OF THE INVENTION

The subject invention relates to an apparatus for processing printing plates in a horizontal, continuous throughput manner. In a typical printing plate processor, the plate, which has a polymer coating on one or both faces thereof, is treated with a developer solution which acts upon the coating on the plate. Depending on the coating and type of developer, the developer will either eat away unwanted portions of the coating leaving a positive image or eat away the portion of the coating carrying the image thus leaving a negative image on the plate. After the plate has been treated with the developer solution, it is brushed so as to remove unwanted coatings on the plate. The plate is then typically rinsed with fresh developer solution and squeeged to remove excess solution from the plate. The processor may also include additional stages whereby the plate is further rinsed with water, and squeeged and a gummer solution placed on the plate in order to preserve the image. A shortcoming of the above described processors deals with the processing of printing plates which have been specially treated with chemicals to enhance the longevity of the plate. More particularly, it has been found that certain chemicals which are added to the plate to render the plate more resistant to wear and tear, tend to particulate during the developing process, the particulate matter tending to form into solid particles, strings, flecks or other solid shapes which are not soluble in the developer solution. In known devices the particulate matter tends to float along the surface of the plate in the developer solution. In addition, the brushes in known devices tend to advance the particles with the plate downstream. If the solid particles are not completely washed off the plate during the process, they tend to be pressed into the plate as the plate is squeeged of excess solution. It will be understood that having these unwanted particles pressed into the plate greatly depreciates the quality of the printing effected by the plate.

Accordingly, it is an object of the subject invention to provide an apparatus for use with particulating printing plates whereby substantially all of the solid particles formed as the plate is being developed are removed from the plate before the plate is squeeged of excess solution.

It is a further object of the subject invention to provide an apparatus having the above recited characteristics which can process a plate in a continuous horizontal and efficient through-put manner.

SUMMARY OF THE INVENTION

In accordance with the above recited objectives, the apparatus of the subject invention includes an outer casing having an entrance end and an exit end, and opposed side portions. The exit end is disposed at an upward tilt relative to the entrance end, and one side portion is disposed at an upward tilt relative to the other side portion. A pair of entry rollers is disposed one above the other adjacent the entrance end of the outer casing for receiving the plate and conveying it in a horizontal direction. A first sprayer for spraying developer solution onto one surface of the plate is disposed adjacent the downstream ends of the entry rollers. Because of the tilt of the outer casing, the flow of developer solution lags behind the travel of the plate, and runs from the leading edge of the plate being conveyed to the trailing end thereof, and from one opposed side portion to the other. A pan member is disposed under the moving plate as it leaves the entry rollers for receiving excess developer solution applied to the plate and acting as a soaker for the plate. Preferably, means for preventing the developer solution which accummulates in the pan from contacting the entry rollers is included between the pan member and the entry rollers. In addition, it is preferable that a drain hose be connected to the pan such that the excess developer solution may be drained off. When such drain hose is employed, it is preferable that means for filtering the used solution be included so that the solution may be again sprayed onto a new plate. Typically, this filtering means may include a basket member having a first coarse mesh lining for catching large size particles and a second, finer mesh liner for catching the smaller size particles. Of course, a pump is included to pump the filtered solution back to the first sprayer.

The subject apparatus further includes a pair of brush rollers which are disposed one above the other adjacent the downstream end of the pan member. The upper brush is individually rotatable, and adapted to be rotated in a direction opposite to that of the conveyance of the plate, and at a rate of speed much greater than that of the entry rollers. Preferably, the top brush includes a spiral squeege member disposed below the pile of the brush. This spiral squeege member may be made from an elastomeric material. The bottom brush rotates in a direction opposite to that of the top brush at a speed lower than that of the top brush. A second sprayer member is disposed adjacent the brush members for spraying fresh developer solution onto the plate after it has been brushed. Preferably, the second sprayer comprises a tubular manifold member having a plurality of spray jet members, the manifold extending from one side portion of the other, with the direction of the spray jets being towards the lower side portion. In addition, it is preferable that each spray jet include a flat nozzle portion such that a flat stream is applied to the plate. Further, it is preferable that the nozzle orifice of each spray jet be much smaller than the diameter of the manifold so that the liquid pressure throughout the entire manifold is the same, and the amount of liquid being sprayed onto the plate by each jet is the same. In the preferred embodiment of the subject invention, the subject apparatus also includes a third sprayer having a plurality of spray jets disposed below the manifold and the path of the plate for spraying the bottom surface of the plate with developer solution.

The subject apparatus further includes a first set of squeege rollers disposed adjacent the manifold member for removing excess solution from the plate. A tray member is disposed below the squeege rollers for capturing solution removed from the plate. Preferably, some of the spray jets of the third sprayer are directed towards the squeege tray so as to fill it, thus keeping a portion of the bottom squeege roller moist.

The subject apparatus may further include additional stages for treating the plate. Typically, the apparatus includes a water sprayer adjacent the first set of squeege rollers for further rinsing the plate; a second set of squeege rollers for removing excess water; a coating sprayer for spraying a coating of gum or other preservatives to the surface of the plate and a third set of squeege rollers for removing excess preservatives from the plate and for directing the plate towards the exit end of the outer casing of the apparatus.

BRIEF DESCRIPTION OF THE DRAWINGS

FIG. 2 is a sectional view of the apparatus of the subject invention, taken along lines 2—2 of FIG. 1.

FIG. 3 is a side elevational view of the apparatus of the subject invention.

DETAILED DESCRIPTION OF THE PREFERRED EMBODIMENTS

Figure 1:
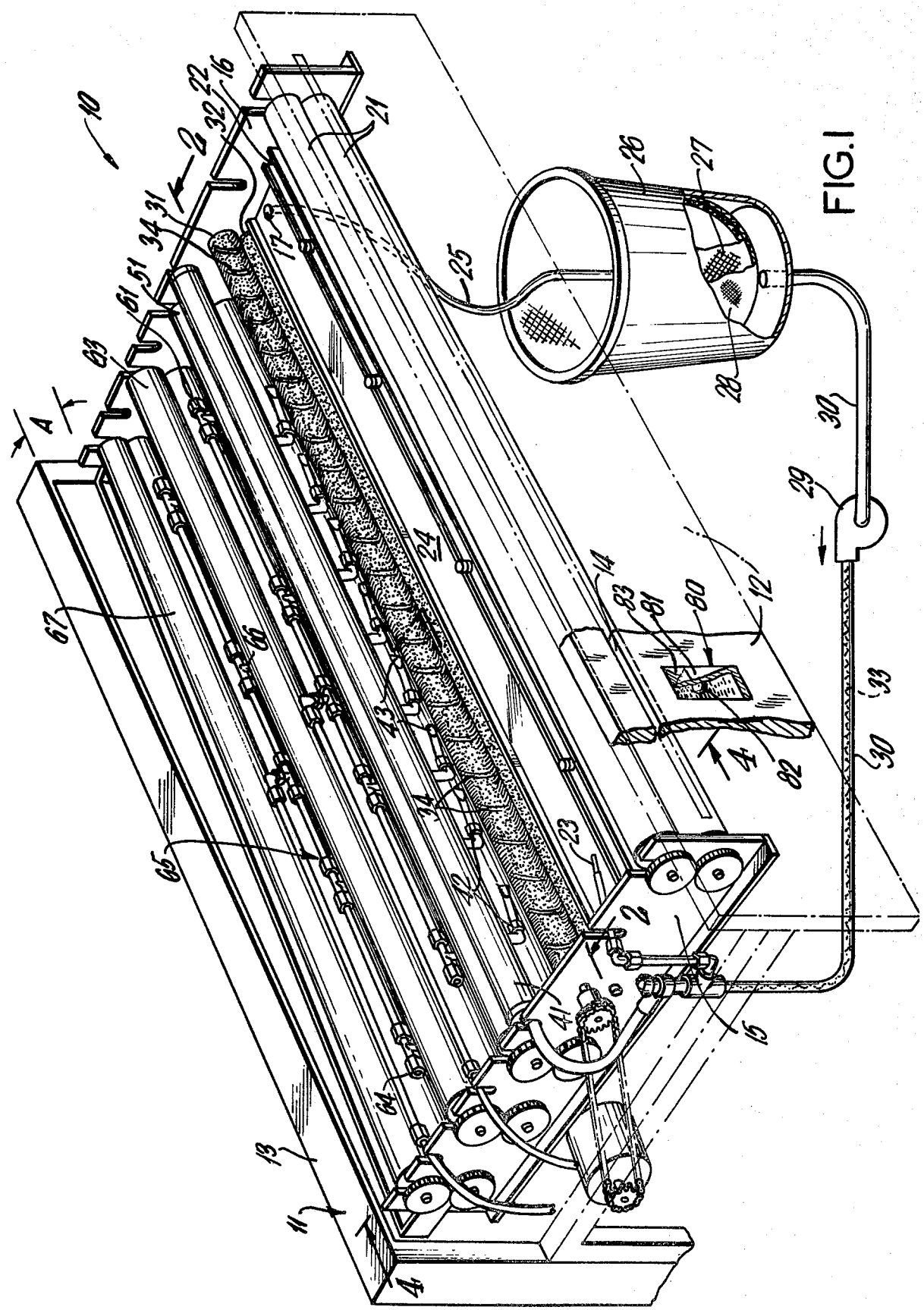
FIG. 1 is a perspective view, phantom in part, of the apparatus of the subject invention.
Figure 4:
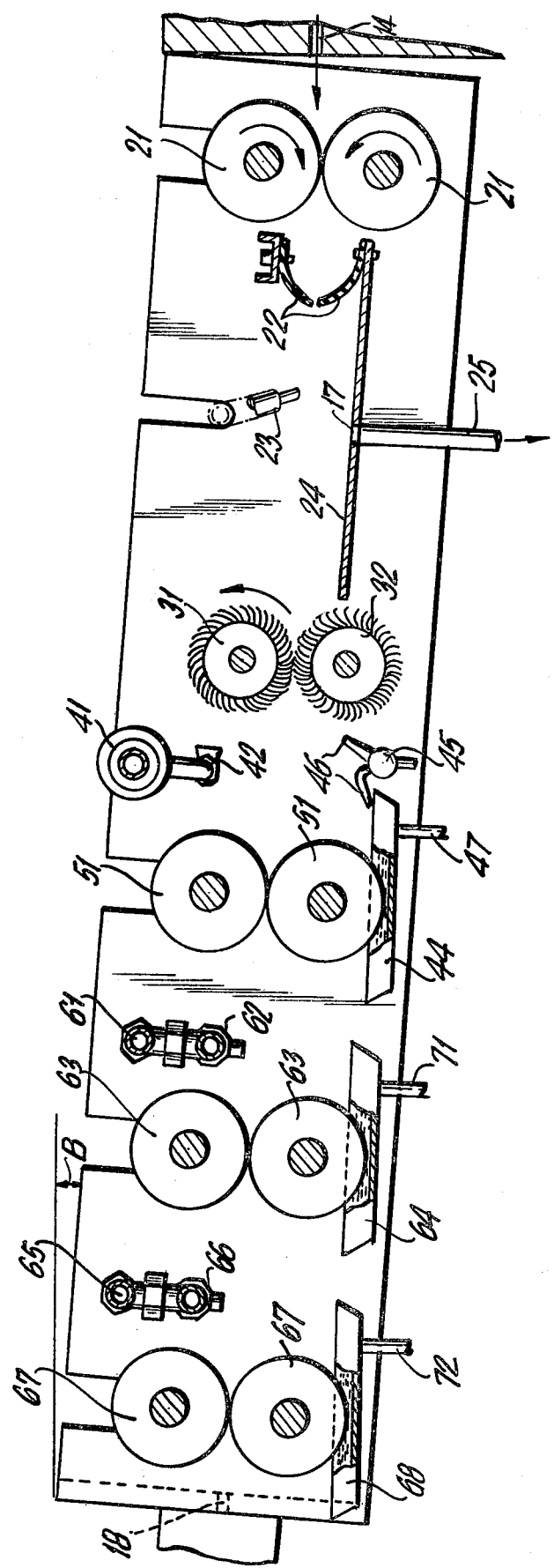
FIG. 4 is a sectional view of the apparatus of the subject invention, taken along lines 4—4 of FIG. 1.

Referring to FIGS. 1-4, the processing apparatus of the subject invention, which is designated generally by reference numeral 10, includes an outer casing 11 having an entry end 12 and a delivery end 13, and opposed side portions 15 and 16. A slot 14 is located at the entry end of the apparatus for receiving the plate to be processed. Referring specifically to FIGS. 1, 3 and 4, it will be noted that the subject apparatus is constructed such that one side portion, namely side portion 15, is disposed at an upward tilt relative to the other side portion 16, the tilt being indicated in FIG. 1 by angle A. In addition, it is preferable that exit end 13 of the apparatus be disposed at an upward tilt relative to entry end 12, the upward tilt being indicated in FIGS. 3 and 4 by angle B. The purpose of the inclined construction of the subject apparatus will be discussed in detail below.

Further referring to the figures, a pair of entry rollers 21 is disposed adjacent slot member 14 of the outer casing 11. Entry rollers 21 are disposed one above the other in nip contact and are rotated so as to receive the plate to be processed from slot 14 and convey it downstream in a horizontal direction. The subject apparatus 10 further includes a first spray member 23 for spraying developer solution onto the coated surface of the plate passing thereunder. Spray member 23 is directed from higher side portion 15 to lower side portion 16. Preferably, a pan member 24 is disposed below the line of travel of the moving plate such that the solution from sprayer 23, running off the plate, may be collected thereby. With continuous operation of the subject apparatus, developer solution accumulates in pan 24 such that the pan serves as a soaker for the plates being processed. Accordingly, it is desirable that the subject invention includes a flexible damming member 22 disposed adjacent entry rollers 21 for preventing the solution accumulated in pan 24 from coming in contact with the entry rollers 21. By keeping the entry rollers 21 dry, slippage of the plate is prevented. A drainage hose 25 is preferably connected to a drainage aperture in pan 24 such that excess developer fluid may be drained. More particularly, it is preferable that drainage hose 25 be connected at one end to drain 17 of pan 24, and the other end thereof to a filtering basket 26 such that the used solution may be reused. Typically basket 26 may have a dual mesh liner. For example, in the preferred embodiment of the subject invention it is preferable that filter basket 26 include a first screen member 27 of the coarse mesh material for capturing the large insoluble particles contained in the developer solution. A second finer mesh screen 28 captures the finer particles of solid matter. The filtered developer solution may then be pumped by pump 29 through filter hose 30 to sprayer 23 and other sprayers to be described below. In the preferred embodiment of the subject invention a heating element 33 may be disposed within filter hose 30 such that the solution fed to sprayer 23 is heated for improved developing action on the plate. In addition, it is preferable that the subject apparatus include means for indicating when the filtered and recycled developer solution needs to be replenished. It will be understood that after a period of time, a certain amount of evaporation occurs in the developer which is generally water or alcohol based. This evaporation causes the developer to become thick or syrupy and impedes the effectiveness thereof. Accordingly, the subject apparatus includes means 80 for indicating when the specific gravity of the developer solution has gone beyond a desired value. In essence, this means 80 comprises a clear tube member 81 connected to the source of developer solution (not shown) into which is inserted a hydrometer or diver 82 having a predetermined specific gravity. When the developer solution gets too thick the diver having a color indicator will rise within the tube of solution to window 83 indicating that the solution needs to be replenished with a certain amount of solvent.

Still referring to the figures, the subject apparatus 10 includes a pair of brush members 31 and 32 disposed adjacent the downstream end of pan member 24. In accordance with the subject invention, top brush roller 31 is individually rotatable, and is rotated in a direction opposite to that of the travel of the plate being processed, and at a speed of rotation greater than that of entry rollers 21, typically at a speed 20 to 25 times greater than that of entry rollers 21. Preferably, top brush roller 31 includes a spiral elastomeric squeege member 34 disposed at a height slightly lower than the pile height of the brush. The function of this squeege portion will be discussed in detail below. Lower brush roller 32 may be stationary, however in the preferred embodiment of the subject invention, it is rotatable in a direction opposite to that of top brush roller 31 and at a slower speed, typically at one half the speed of top brush roller 31.

The subject apparatus 10 further includes a second spray means 41 comprising a tubular manifold member 41 disposed adjacent brush rollers 31 and 32. Preferably, manifold 41 includes a plurality of spray jet members 42 which are each directed towards lower side portion 16 of the apparatus. As indicated in FIG. 1, manifold 41 may be connected to filter hose 30 such that the filtered developer solution collected from pan member 24 may be recirculated and sprayed through spray jets 42. Preferably, each of the spray jets 42 includes a flat nozzle portion 43 such that a flat stream of liquid may be sprayed onto the plate passing thereunder. In addition, it is preferable that the orifice of each spray nozzle have a diameter substantially less than that of the manifold itself such that equal liquid pressure is maintained throughout the entire manifold, and an equal amount of fluid sprayed through each spray nozzle. As illustrated in FIG. 1, the jets 42 may be arranged in staggered formation such that they do not interfere with one another. In the preferred embodiment of the subject invention, a third spray means comprising a fountain bar 45 is disposed under manifold 41 such that the plate to be processed passes between manifold 41 and fountain bar 45. The fountain bar 45 has a plurality of jets 46 for spraying the bottom of the plate with developer solution in a direction away from the plate travel. In addition, certain of the spray jets 46 of the fountain may be directed in the direction of travel of the plate for purposes to be discussed below.

Further referring to the figures, the subject apparatus 10 includes a pair of squeege rollers 51 for removing excess solution from the plate being processed. Squeege rollers 51 are disposed one above the other in nip contact adjacent manifold 41. Preferably, a tray member 44 is disposed under the squeege rollers for receiving the solution removed from the plate, tray member 44 having a drainage hose 47 for draining and recycling excess solution. Further it is preferable that some of the spray jets 46 of fountain bar 45 be directed towards tray member 44 so as to keep a predetermined level of solution therein thus maintaining the bottom squeege continuously moist.

In one embodiment of the subject invention, squeege rollers 51 are immediately adjacent exit end 13 of the apparatus such that they convey the processed plate through exit slot 18 for further treatment by a separate apparatus. However, in the preferred embodiment of the subject invention, apparatus 10 includes further stages for rinsing and applying a preservative coating to the subject plate, such that the plate may be fully and continuously processed by one machine. More particularly, a fourth spray means 61 is disposed downstream of squeege rollers 51 for spraying a water solution onto the plate after it leaves squeege rollers 51. Fourth spray means 61 comprises a plurality of spray jets 62 which are directed laterally in the direction from the high side 15 of the apparatus to the low side 16 thereof to promote the lateral flow of liquid. A second pair of squeege rollers 63 is disposed adjacent fourth spray means 61 for removing excess water solution from the plate. A tray member 64 is disposed below rollers 63 and sprayer 64 for catching excess water. Tray member 64 preferably has a drain member 71 for draining the water and recycling it for further use. In the preferred embodiment of the subject invention, the apparatus 10 further includes a fifth spray means 65 for spraying a gummer or preservative coating onto the surface of the plate. Gummer sprayer 65 comprises a plurality of spray nozzles 66 which are directed laterally from the higher side of the apparatus to the lower side thereof. A third pair of squeege rollers 67 is disposed adjacent spray means 65 for removing excess preservative from the plate, and conveying the plate to delivery slot 18 of exit end 13 thereof for removal. Disposed underneath squeege rollers 67 and gummer spray 65 is a tray member 68 for collecting excess perservative solution. In addition, tray member 68 may include a drainage hose 72 for recycling the excess solution for further use.

In accordance with the subject invention, entry rollers 21, and squeege rollers 51, 63 and 67 all rotate at the same speed in the direction of travel of the plate. The rollers may be individually driven or driven by one driving means. Brush rollers 31 and 32, on the other hand, are each individually driven, with top roller 31 being driven in a direction opposite to that of the travel of the plate and at a speed greater than that of the other rollers, typically on the order of 20 to 25 times greater. Bottom brush roller 32 rotates in a direction opposite to that of upper brush roller 31 and at a speed on the order of one half that of brush roller 31.

Referring now specifically to FIGS. 1 and 4, in operation, the plate to be processed is fed into slot 14 at the entry end of the apparatus, either manually, or by automatic conveying means. The plate is then received in the nip of entry rollers 21 and driven in a horizontal direction thereby. The plate then passes under first spray means 23 which applies a developer solution onto the surface of the plate having the image carrying coating. Because the apparatus tilts downwardly from the exit end thereof to the entry end thereof, the flow of developer solution on the plate, including the particulate matter (formed by the action of the developer on the plate's polymer coating) floating thereon, lags behind the travel of the plate, and in fact, is directed opposite to the travel of the plate, towards the entry end of the apparatus. Damming member 22 prevents the solution from coming in contact with the entry rollers 21, thus keeping them dry and preventing slippage of the plate in the roller nip. In addition, because the subject apparatus is tilted laterally downwardly from the left side portion thereof to the right side portion thereof, the flow of developer solution and particulate matter floating thereon is directed laterally to the right side of the apparatus where it flows out through drain hose 25 for filtering and recycling. After the plate has been sprayed by sprayer 23, it is pushed into the nip of brush rollers 31 and 32 by entry rollers 21. Brush rollers 31 and 32 act on the surface of the plate for removing the unwanted polymer coating, thus leaving the desired image. As indicated above, top brush roller 31 rotates in a direction opposite to that of the travel of the plate. As a result, the solid insoluble particulate matter remaining on the plate after treatment with the developer solution is flicked in a backward direction away from the travel of the plate. In addition, because of the spiral elastomeric squeege 34 disposed on the top brush roller 31 a screwing effect for removing developer solution and the particulate matter off the plate in a direction of lateral flow is created. After the plate leaves the brush rollers, the top surface thereof is again sprayed with fresh developer solution by second spray means, namely, manifold 41. In addition, the bottom surface of the plate is also sprayed with developer solution by fountain bar 45. It will be noted that as the leading portion of the plate is being sprayed by manifold 41 and sprayer 45 the remaining portion of the plate is being scrubbed by brushes 31 and 32. Because of the inclined construction of the apparatus, the solution from manifold 41 will flow backwards towards the brushes thus facilitating their action on the plate. It also provides an additional backward flow for directing any particulate matter through the nip of the brushes and towards drain hose 25 of pan member 24. It will be further noted that before and after a plate passes between manifold 41 and spray fountain 45 that said manifold and fountain bar continuously apply developer solution to brush rollers 31 and 32, thus continuously rinsing them of unwanted residue. In addition, it will be noted that when no plate is passing between the nip of brush rollers 31 and 32, bottom brush roller 32 acts to deflect particulate matter on the surface of top brush roller 31 in a backward direction thus keeping the top brush roller clean.

Thus, because of the tilted orientation of the subject apparatus, along with the orientation of the various spray means, and the cooperation of the brush rollers, the plate is delivered to a set of squeege rollers 51 substantially free of any solid matter that would otherwise be impressed into the plate by the squeege rollers thus causing an imperfect plate. As indicated above, in the preferred embodiment of the subject invention the subject apparatus 10 includes a further rinsing stage and a preservative application stage in addition to the developer stage. Thus, after the plate has been substantially dried by the first set of squeege rollers 51 it passes under fourth spray means 61 which applies a water solution to the surface of the plate. The plate then passes between second pair of squeege rollers 63 which remove excess water from the surface of the plate and convey the plate further downstream. The plate then passes under a fifth spray means 66 which sprays a preservative coating onto the surface of the plate. The plate then passes through a final set of squeege rollers 67 which remove excess preservative solution from the plate and direct the plate towards the exit end of the apparatus and through delivery slot 18.

In summary, the subject invention provides a new and improved apparatus for processing printing plates in a continuous horizontal through-put manner. Because of the specific construction of the apparatus, the plates which are processed thereby are substantially free of defects caused by the particulation of the polymer coating during developing.

While there have been described herein what are at present considered preferred embodiments of the invention, it will be obvious to those skilled in the art that many modifications and changes may be made therein without departing from the essence of the invention. It is therefore to be understood that the exemplary embodiments are illustrative and not restrictive of the invention, the scope of which is defined in the appended claims, and that all modifications that come within the meaning and range of equivalency of the claims are intended to be included therein.

What is claimed is:

1. An apparatus for processing a particulating printing plate having an image carrying coating on one face thereof in a horizontal, continuous, through-put manner comprising:
    an outer casing having an entrance end and an exit end, and a pair of opposed side portions, one of said side portions being disposed at an upward tilt relative to the other side portion;
    a pair of rotatable entry rollers disposed one above the other in nip contact adjacent the entrance end of the outer casing for receiving the plate and conveying it in a horizontal direction;
    first spray means disposed adjacent the downstream end of said entry rollers for laterally spraying developer solution onto the image carrying surface of the plate as the plate leaves said entry rollers;
    first and second rotatable brush rollers for removing unwanted coating on said plate, said brush rollers being disposed in nip contact with one another adjacent said first spray means, said first brush roller being in contact with the particulating image carrying coating on said one face of the particulating printing plate, said first brush roller including a spiral squeege member disposed below the outer surface of the pile of said first brush roller, which squeege member functions to provide a screwing effect for removing said developer solution and the particulate off the plate in the direction of said lateral flow of developer solution;
    second spray means disposed adjacent the downstream end of said brush rollers for spraying developer solution onto the image carrying surface of the plate after the plate leaves the nip of said first and second brush rollers;
    a first pair of squeege rollers disposed adjacent said second spray means, one above the other to form a nip for receiving the plate, removing excess solution from the plate and transporting the plate in a horizontal direction towards the exit end of the outer casing;
    means for rotating said entry rollers and said squeege rollers at substantially the same speed in the direction of travel of the plate;
    means for individually rotating said first brush roller in a direction opposite to that of the travel of the plate, and at a speed greater than that of said entry rollers; and
    means for rotating said second brush roller in a direction opposite to that of said first brush roller and at a slower speed than that of said first brush roller.

2. An apparatus as recited in claim 1 in which said exit end is disposed at an upward tilt relative to said entrance end.

3. An apparatus as recited in claim 1 in which said first spray means is directed from said upper side portion to said lower side portion.

4. An apparatus as recited in claim 1 which further includes means for collecting excess developer solution applied by said first spray means as the solution flows off the image carrying surface of the plate, said collecting means comprising a pan member disposed under the path of travel of the plate.

5. An apparatus as recited in claim 4 in which said means for collecting excess developer solution, applied by said first spray means, as the solution flows off the image carrying surface of the plate further comprises a drainage hose, one end of which is connected to a drainage aperture in said pan member, the other end of which is connected to a filtering means and a pump for recirculating the filtered solution to said first spray means.

6. An apparatus as recited in claim 5 in which said filter means includes a basket member having a first coarse mesh lining, and a second fine mesh lining disposed between said coarse mesh lining and the inner surface of said basket member.

7. An apparatus as recited in claim 4 in which said drainage aperture is disposed adjacent said lower side portion of the apparatus.

8. An apparatus as recited in claim 4 which further comprises means for preventing developer solution collected in said pan member from contacting said entry rollers.

9. An apparatus as recited in claim 1 in which said first brush roller rotates at a speed in a range of 20 to 25 times faster than said entry rollers and squeege rollers.

10. An apparatus as recited in claim 1 in which said second brush roller rotates at a speed approximately one half that of said first brush roller.

11. An apparatus as recited in claim 1 which further comprises a third spray means disposed below said second spray means and the path of travel of said plate, adjacent said first and second brush rollers for spraying developer solution onto the bottom surface of the plate after it leaves said brush rollers.

12. An apparatus as recited in claim 11 in which said third spray means comprises a plurality of spray jet members, some of which are directed upwardly and towards said first and second brush rollers, and the other spray jets being directed toward the path of travel of the plate.

13. An apparatus as recited in claim 1 which further comprises means for collecting the developer solution as the solution flows off the plate as it passes under said second spray means and as it is removed from the plate by said squeege rollers, said collecting means being disposed under said squeege rollers and said second spray means.

14. An apparatus as recited in claim 13 in which said collection means further includes means for pumping the solution collected back to said second spray means.

15. An apparatus as recited in claim 1 in which said second spray means comprises a tubular manifold member extending from said upward side portion to said lower side portion, said manifold member having a plurality of spray jet members.

16. An apparatus as recited in claim 15 in which said manifold member has a diameter greater than that of each spray jet member orifice such that an equal liquid pressure is maintained in said manifold member and an equal amount of developer solution is sprayed through each spray jet member.

17. An apparatus as recited in claim 16 in which said manifold spray jet members each include a flat nozzle portion for emitting a flat stream of liquid.

18. An apparatus as recited in claim 1 which further comprises a fourth spray means for spraying water onto the image carrying surface of said plate, said fourth spray means being disposed adjacent the downstream end of said first squeege rollers.

19. An apparatus as recited in claim 18 which further comprises a second pair of squeege rollers disposed adjacent said fourth spray means for removing excess water from the surface of the plate; means disposed under said second squeege rollers and said fourth spray means for collecting the excess water; and means for pumping the excess water back to said fourth spray means.

20. An apparatus as recited in claim 19 which further comprises a fifth spray means disposed adjacent said second pair of squeege rollers for applying a preservative coating onto the image carrying surface of the plate; a third pair of squeege rollers adjacent said fifth spray means for removing excess preservative from said plate and for conveying said plate in a horizontal direction towards the exit end of the apparatus; and means for collecting excess preservative solution from said fifth spray means and from said squeege rollers and pumping said excess coating back to said fifth spray means.

21. An apparatus as recited in claim 1 which further comprises means for heating the solution sprayed by said first spray means.

22. An apparatus as recited in claim 1 which further comprises means for indicating when the developer solution being sprayed by said first spray means has exceeded a predetermined specific gravity value.

23. An apparatus for processing a particulating printing plate having an image carrying coating on one face thereof in a horizontal, continuous, through-put manner comprising:
an outer casing having an entrance end and an exit end, and a pair of opposed side portions, one of said side portions being disposed at an upward tilt relative to the other side portion;
a pair of rotatable entry rollers disposed one above the other in nip contact adjacent the entrance end of the outer casing for receiving the plate and conveying it in a horizontal direction;
first spray means disposed adjacent the downstream end of said entry rollers for laterally spraying developer solution onto the image carrying surface of the plate as the plate leaves said entry rollers;
first and second brush rollers for removing unwanted coating on said plate, said brush rollers being disposed in nip contact with one another adjacent said first spray means, said first brush roller being rotatable and being in contact with the particulating, image carrying coating on said one face of the printing plate, said second brush roller being stationary, said first brush roller including a spiral squeege member disposed below the outer surface of pile of said first brush roller, which squeege member functions to provide a screwing effect for removing said developer solution and the particulate off the plate in the direction of said lateral flow of developer solution;
second spray means disposed adjacent the downstream ends of said brush rollers for applying developer solution to the coated surface of the plate after the plate leaves the nip of said first and second brush rollers;
a first pair of squeege rollers disposed adjacent said second spray means, one above the other to form a nip for receiving the plate, removing excess solution from the plate and transporting the plate in a horizontal direction towards the exit end of the outer casing;
means for rotating said entry rollers and said squeege rollers at substantially the same speed in the direction of travel of the plate; and
means for individually rotating said first brush roller in a direction opposite to that of the travel of the plate, and at a speed greater than that of said entry rollers.

24. An apparatus for processing a particulating printing plate having an image carrying coating on one face thereof in a horizontal, continuous, through-put manner comprising:
an outer casing having an entrance end, an exit end, and a pair of opposed side portions, one of said side portions being disposed at an upward tilt relative to the other side portion, said exit end being disposed at an upward tilt relative to said entrance end;
a pair of rotatable entry rollers disposed one above the other in nip contact adjacent the entrance end of the outer casing for receiving the plate, and conveying it in a horizontal direction;
first spray means disposed adjacent the downstream ends of said entry rollers for laterally spraying developer solution onto the image carrying surface of the plate, said first spray means being directed from said higher side portion towards said lower side portion;
means for collecting excess developer solution applied by said first spray means as said solution flows off the surface of the plate;
first and second rotatable brush rollers for removing unwanted coating on said plate, said brush rollers being disposed in nip contact with one another adjacent said first spray means, said first brush roller including a spiral squeege member extending along its length and disposed below the outer surface of the pile of said first brush roller, said first brush roller being in contact with the particulating, image carrying coating on said one face of the plate such that said squeege member functions to provide a screwing effect for aiding in removing said developer solution and the particulate off the plate in the direction of said lateral flow of developer solution;

second spray means for laterally spraying developer solution onto the image carrying surface of the plate after the plate leaves the nip of said brush rollers, said second spray means comprising a tubular manifold member extending from the high side portion of the casing to the lower side portion thereof, said manifold member including a plurality of spray jets each of which is directed towards said lower side portion of the outer casing, each of said spray jets having a flat nozzle portion for emitting a flat stream of solution, the diameter of said manifold being greater than that of each nozzle orifice such that an equal amount of solution is emitted from each nozzle, said second spray means being disposed adjacent the downstream ends of said brush rollers such that when no plate is being passed under said second spray means, said second spray means sprays said brush rollers with developer solution;

a pair of squeege rollers disposed adjacent said second spray means, one above the other to form a nip for receiving the plate, removing excess solution from the plate and conveying the plate in a horizontal direction toward the exit end of the outer casing;

means for rotating said entry rollers and squeege rollers at substantially the same speed in the direction of travel of the plate;

means for individually rotating said first brush roller in a direction opposite to that of the travel of the plate and at a speed greater than that of said entry rollers; and means for rotating said second brush roller in a direction opposite to that of said first brush roller, and at a slower speed than that of said first brush roller.

* * * * *